United States Patent [19]

Ali et al.

[11] Patent Number: 5,157,323
[45] Date of Patent: Oct. 20, 1992

[54] SWITCHED LOW-LOSS ATTENUATOR

[75] Inventors: Fazal Ali, Santa Clara; Allen F. Podell, Palo Alto, both of Calif.

[73] Assignee: Pacific Monolithics, Sunnyvale, Calif.

[21] Appl. No.: 575,407

[22] Filed: Aug. 28, 1990

[51] Int. Cl.$^5$ .................... H01P 1/22; H03H 11/24
[52] U.S. Cl. ................... 323/369; 333/81 R; 330/284
[58] Field of Search ............. 323/369; 333/81 R, 23, 333/28 R, 171; 330/151, 284

[56] References Cited

U.S. PATENT DOCUMENTS

| | | | |
|---|---|---|---|
| 4,216,444 | 8/1980 | Vergnolle et al. | 333/81 R |
| 4,787,686 | 11/1988 | Tajima et al. | 333/81 R X |
| 4,837,530 | 6/1989 | Kondoh | 333/81 A |

FOREIGN PATENT DOCUMENTS 60-102011  12/1985  Japan .

OTHER PUBLICATIONS

Lemnois et al., "RF Missile Seeker Components Realized by ASMMIC Techniques", *Microwave Journal*, vol. 31, No. 6, Jun. 1988, pp. 167-176.
Tajima et al., "GaAs Monolithic Wideband (2–18 GHz) Variable Attenuators", *IEEE MTT-S Digest*, 1982, pp. 479-481.
Kondoh, "DC-50GHz MMIC Variable Attenuator with a 30dB Dynamic Range", *IEEE MTT-S Symposium Digest*, 1988, pp. 499-502.
Barta et al., "Surface-Mounted GaAs Active Splitter and Attenuator MMIC's Used in a 1–10-GHz Leveling Loop", *IEEE Transactions on Microwave Theory and Techniques*, vol. MTT-34, No. 12, Dec. 1986, pp. 1569-1575.
Gupta et al., "A 0.05— to 14-GHz MMIC 5-Bit Digital Attenuator", *GaAs IC Symposium*, IEEE, 1987, pp. 231-234.
Hwange et al., "A Microwave Phase and Gain Controller with Segmented-Dual-Gate MESFETs in GaAs MMICs", *IEEE MTT-S Monolithic Symposium*, 1984, pp. 1-5.
Jones, "Digitally Controlled MMIC Attenuators-Techniques and Applications", *Military Microwave Conference*, 1988, pp. 217-222.

*Primary Examiner*—Emanual T. Voeltz
*Attorney, Agent, or Firm*—Edward B. Anderson

[57] ABSTRACT

A double-$\pi$ network includes a pair of series resistors connected between input and output terminals. A plurality of FETs of different widths and/or in series with resistors, are each connected in parallel with one of the series resistors. Each FET is controlled jointly with an FET of the same gate size associated with the other series resistor, so that select ones of the FETs, or none may be conducting in parallel with the series in-line resistances. Another plurality of intermediate FETs having gates with different widths, are connected in parallel and separately controllable for coupling selectively the junction between the two in-line resistors to ground. Finally, an additional plurality of pairs of FETs couple the input and output terminals to ground. The FETs making up each pair have gates with the same width and are jointly controllable. The FETs in the different pairs have different widths and/or are in series with different sized resistors. By controlling operation of the FETs, different attenuation configurations, such as $\pi$, T, and double-$\pi$, are produced as well as different discrete attenuation levels.

11 Claims, 2 Drawing Sheets

SWITCHED LOW-LOSS ATTENUATOR

FIELD OF THE INVENTION

This invention relates to attenuators, and particularly to attenuators formed with switched resistive elements for varying the element configuration and attenuation values.

BACKGROUND OF THE INVENTION

Voltage-controlled variable attenuators have been widely used for automatic gain control circuits as well as for various switches. In broadband microwave amplifiers, they are indispensable for temperature compensation of gain variation.

Historically, variable attenuation was realized by PIN diodes and a pair of hybrid couplers. However, the frequency performance of these attenuators is limited by the bandwidth of the hybrid couplers. More significantly, these attenuators are not compatible with GaAs monolithic circuits because of the PIN diodes.

As a result of this incompatibility, there were developed at least four forms of variable attenuators that are constructed as GaAs monolithic circuits. The first two of these involve the use of FETs (field-effect transistors) in T- or π-configurations, such as is described by Tajima et al. in "GaAs Monolithic Wideband (2-18 GHz) Variable Attenuators", *IEEE MTT-S Digest*, 1982, pages 479-481. In these basic configurations, however, parasitic capacitance of the FETs degrades the high-frequency performance of an attenuator at both maximum and minimum attenuation states.

Modifications to the basic configurations have therefore been developed to overcome this basic limitation. A modified T-configuration is described by Kondoh in "DC-50 GHz MMIC Variable Attenuator with a 30 dB Dynamic Range", *IEEE MTT-S Symposium Digest*, 1988, pages 499-502. This configuration requires the use of high impedance lines to separate four FET shunt cells.

An alternative approach, in what is referred to as a bridged-T configuration, is described by Barta et al. in "Surface-Mounted GaAs Active Splitter and Attenuator MMIC's Used in a 1-10-GHz Leveling Loop", *IEEE Transactions on Microwave Theory and Techniques*, Vol. MTT-34, No. 12, December 1986, pages 1569-1575. This circuit uses a reference (duplicate) cell and op amp to reduce control of two FETs, operated in the linear range, to a single control input.

A third approach has been to use cascaded switchable attenuation circuits that are selectively replaced with a reference path. Such an approach is disclosed by Gupta et al. in "A 0.05- to 14-GHz 5-Bit Digital Attenuator", *GaAs IC Symposium*, IEEE, 1987, pages 231 to 234. T-networks are used for each digitally selectable segment of the attenuation path. Attenuation ratios for each bit are provided by using different FET gate widths and shunt resistor values.

A fourth approach has been the use of segmented dual-gate MESFETs, as described by Hwang et al. in "A Microwave Phase and Gain Controller With Segmented-Dual-Gate MESFETs in GaAs MMICs", *IEEE MTT-S Monolithic Symposium*, 1984, pages 1-5. With this approach digital gain control is achieved by properly scaled gate-width ratios among the dual-gate MESFETs.

The various approaches are discussed by Jones in "Digitally Controlled MMIC Attenuators - Techniques and Applications", *Military Microwave Conference*, 1988, pages 217-222. Jones selects the segmented dual-gate approach for its compactness and reduced input loss.

The minimum number of control bits of a digital attenuator defines the maximum range of attenuation that can be achieved. For example, Gupta uses a 5-bit attenuator design of 8-, 4-, 2-, 1-, and 0.5-dB selectable attenuation components, resulting in 15.5-dB dynamic range and 0.5-dB step resolution. If 1-dB step resolution is used, a 5-bit attenuator can achieve a dynamic range of 31-dB.

These cascaded multi-section methods characteristically have high insertion loss at the minimum attenuation state due to the losses of the reference path associated with each bit. PIN diodes, as mentioned, have lower loss as switching devices than GaAs FETs, but are not compatible with GaAs monolithic process technology. Segmented dual-gate attenuators have lower loss but require the use of switches on the main signal path that create noise, add losses due to parasitic capacitance of the switching devices, have D.C. power dissipation, requires input and output impedance-matching circuitry, and have limited power-handling capability.

SUMMARY OF THE INVENTION

The present invention provides a novel design for the implementation of a multi-bit digital attenuator. Various features of the invention provide reduced insertion loss and the elimination of switches in the main signal path. In its preferred form, the invention provides a single composite structure which defines the various attenuation states. The use of segmented gates and separate series-bit networks is also avoided.

These features are generally accomplished in a switched attenuator having an input terminal for receiving an input signal to be attenuated, and an output terminal for outputting the attenuated input signal. A pair of first resistance components extend in series between the input terminal and the output terminal and join at a junction.

A second resistance component is controllable for selectively coupling the junction between the pair of first resistance components to a reference voltage, such as ground. A pair of third resistance components are controllable jointly for selectively coupling the input terminal and the output terminal to the reference voltage. At least one of the second resistance components and the pair of third resistance components conducts at a time, except for the minimum loss state.

In a preferred embodiment made according to the invention, the first resistance components include a resistor and a plurality of FETs, of different widths or in series with a resistor, all connected in parallel. Each FET is controlled jointly with an FET of the same gate size in the other first resistance component, so that select ones of the FETs, or none may be conducting in parallel with the series in-line resistances.

Another plurality of intermediate FETs having gates with different widths, connected in parallel and separately controllable for coupling selectively the junction between the two in-line resistors to ground.

Finally, an additional plurality of pairs of FETs couple the input and output terminals to ground. The FETs making up each pair have gates with the same width and are jointly controllable. The FETs in the different pairs have different widths and/or are in series with a different sized resistor.

By switching the various FETs and FET pairs on and off, the configuration and attenuation of the attenuator is varied. By selection of appropriate gate widths and resistances, the various configurations result in desired stepped attenuation value between input and output. This preferred design always has a set of series resistors in line that provide a distortionless, passive signal path. The preferred embodiment provides 16 attenuation states varying from less than 2 dB to almost 16 dB.

These and other features and advantages of the present invention will be apparent from the disclosure contained in the following detailed description and the associated drawings.

DETAILED DESCRIPTION OF THE PREFERRED EMBODIMENT

Figure 1:
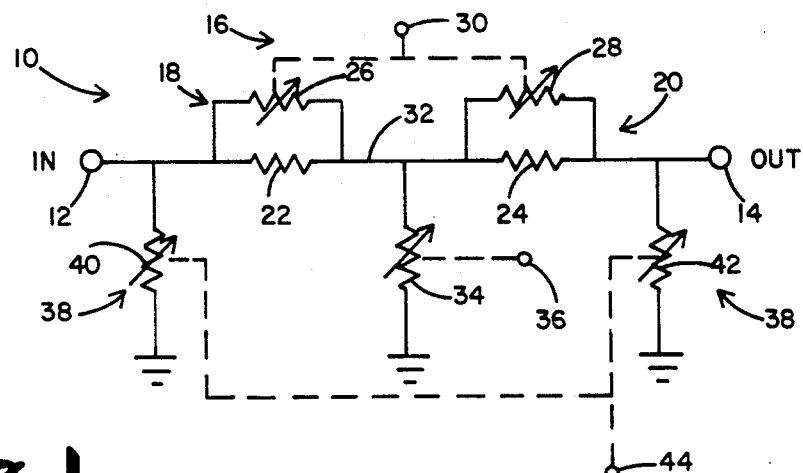
FIG. 1 is a general circuit representation of a variable attenuator made according to the present invention.

Referring initially to FIG. 1, a variable attenuator 10 made according to the invention includes an input terminal 12 and an output terminal 14 coupled together by a pair 16 of first impedances 18 and 20 connected in series. Impedances 18 and 20 are equal and include series resistors 22 and 24, respectively. Resistors 22 and 24 are connected in parallel with variable first resistances 26 and 28, respectively. The value of resistances 26 and 28 is determined by a common control line 30. The impedance of each of first impedances 18 and 20 is thus the result of the parallel combination of the respective series resistors and resistances.

First impedances 18 and 20 are connected at what may be considered a junction 32. This junction is coupled to a circuit reference voltage, preferably ground, via a second variable, shunt impedance 34. When this impedance has a non-infinite value, as determined by a control line 36, the pair 15 of first impedances and second impedance 34 form a T-configuration attenuator.

A pair 38 of third variable, shunt impedances 40 and 42 shunt the input terminal 12 and the output terminal 14 to ground. These impedances are equal and are controlled by a common control line 44. When impedances 34, 40 and 42 have non-infinite values, attenuator 10 has a double-$\pi$ configuration. When impedance 34 has infinite value, the attenuator has a single-$\pi$ configuration. Except in the minimum loss state, at least one of second impedance 34 and pair 38 of third impedances has a non-infinite value at any given time, to provide a shunt path in the attenuation network.

Figure 2:
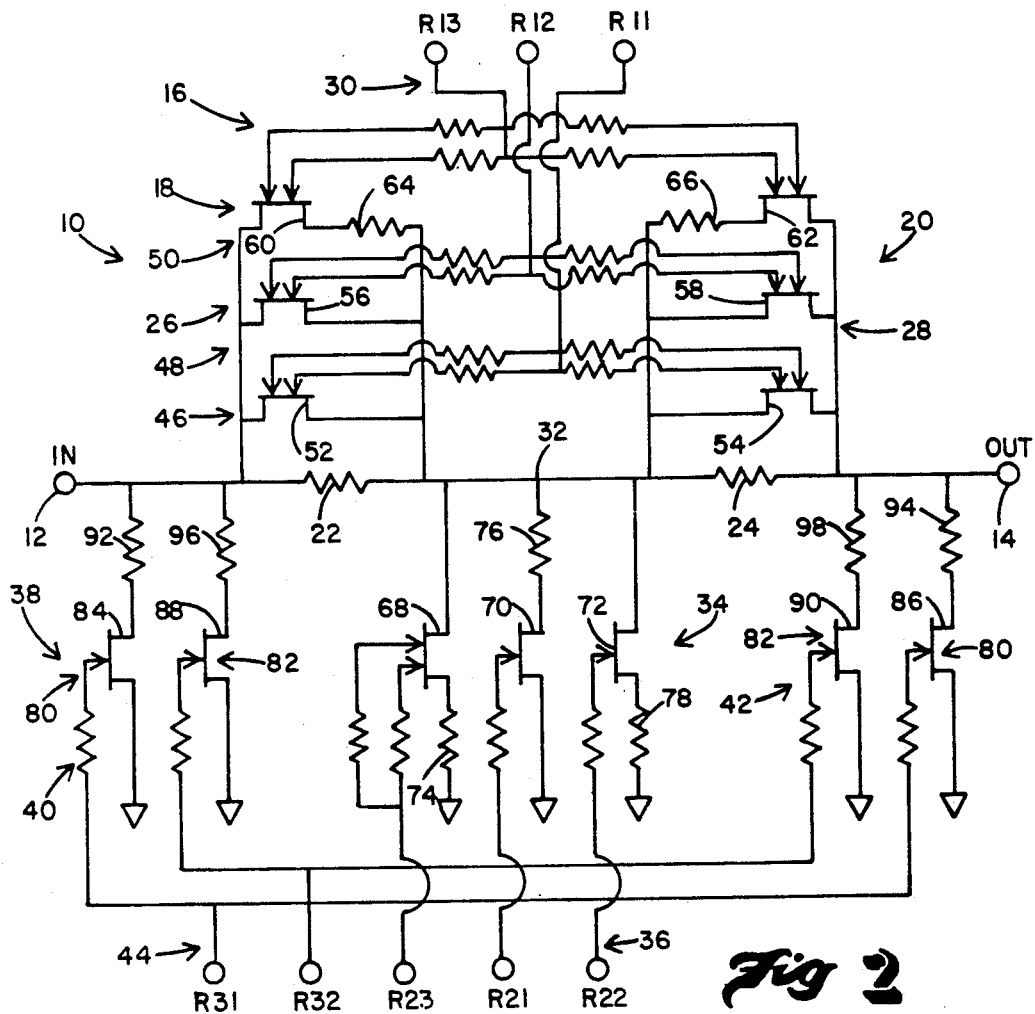
FIG. 2 is a circuit schematic of the circuit of FIG. 1.

Referring now to FIG. 2, the specific structure of a preferred embodiment of attenuator 10 is shown. In this circuit, resistors 22 and 24 each have a value of 37 ohms. Left and right variable resistances 26 and 28 consist of three pairs 46, 48 and 50 of dual-gate FETs, with the FETs in each pair being of the same size and commonly controlled. FETs 52 and 54 of pair 46 have a gate width of 308 micrometers (um) and are controlled on a control line R11. FETs 56 and 58 of pair 48 have a gate width of 69 um and are controlled on a control line R12. FETs 60 and 62, controlled on line R13, have the same gate width as FETs 56 and 58, but also are connected in series with 100 ohm resistors 64 and 66, respectively, to increase the resistance of the branch in parallel with series resistors 22 and 24, thereby increasing the effective resistance of impedances 18 and 20. Impedances 18 and 20 have their highest values when the parallel FETs are switched off.

Each control line has an in-line relatively high value resistance in order to isolate the control circuits from attenuator 10.

Second impedance 34 includes three FETs 68, 70 and 72, each coupling junction 32 to ground. These three FETs have respective gate widths of 170 um, 106 um and 138 um; are in series with respective resistors 74, 76 and 78 of 14, 92 and 40 ohms, respectively; and are controlled on respective control lines R23, R21 and R22, as shown. FET 68 has two gates and FETs 70 and 72 each have one gate.

Pair 38 of third impedances includes pairs 80 and 82 of respective FETs 84 and 86, and 88 and 90. The respective gate-widths of the FETs in these pairs is 21 um and 42 um. FETs 84 and 86 are in series with 400 ohm resistors 92 and 94. Similarly, FETS 88 and 90 are in series with 200 ohm resistors 96 and 98. These two pairs of FETs are controlled on control lines R31 and R32, respectively. Thus, depending on the states of the various FETs, impedance 40 comprises FET 82 and resistor 92 and/or FET 88 and resistor 96. Correspondingly, impedance 42 comprises FET 86 and resistor 94 and/or FET 90 and resistor 98.

Figure 3:
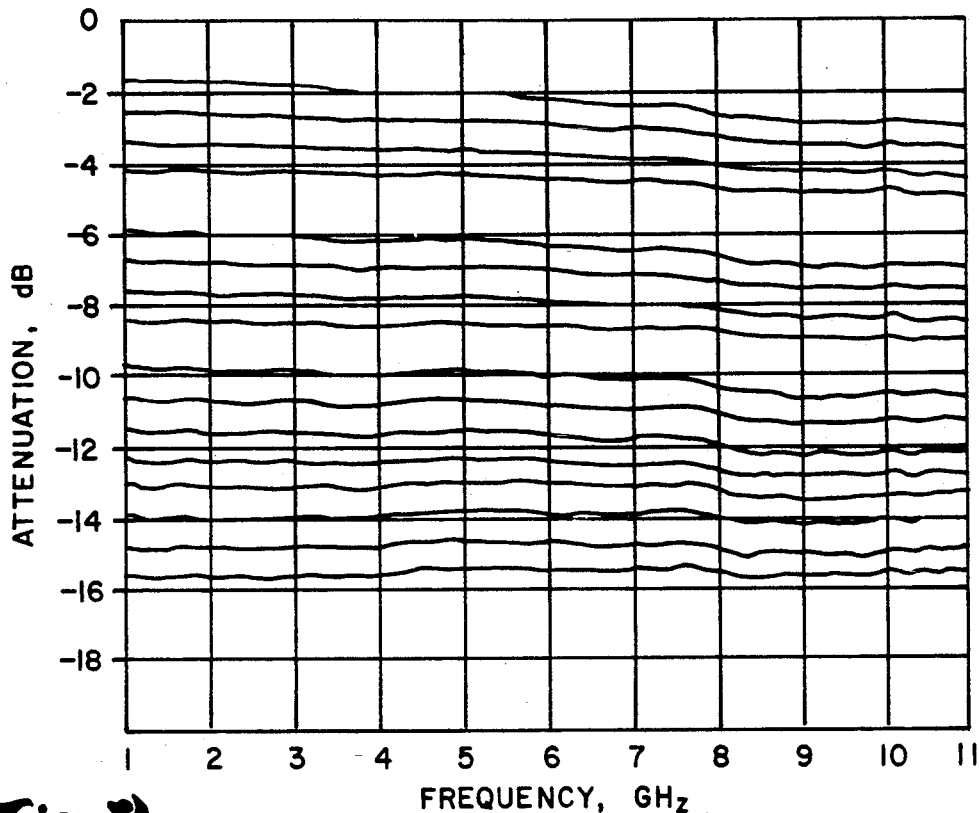
FIG. 3 is a diagram showing attenuation steps achieved with the circuit of FIG. 2.

By applying enabling and disabling signals on the various control lines, different attenuation configurations, as has been described, can be effected for producing different levels of attenuation. The table below gives some representative values on the control lines to achieve various of the 16 steps of attenuation shown in FIG. 3, comparable to a four-bit control code. A four-bit control signal can be applied to attenuator 10 by interfacing the attenuator control lines with a decoder that generates actual control signals corresponding to the attenuation level identified by the selected four-bit code.

TABLE

| Atten. Step | CONTROL LINES | | | | | | | | Config. |
|---|---|---|---|---|---|---|---|---|---|
| | R11 | R12 | R13 | R21 | R22 | R23 | R31 | R32 | |
| 4 | 1 | 0 | 0 | 0 | 0 | 0 | 1 | 1 | $\pi$ |
| 5 | 0 | 1 | 0 | 1 | 0 | 0 | 0 | 0 | T |
| 6 | 0 | 1 | 0 | 1 | 0 | 0 | 1 | 0 | Dbl $\pi$ |
| 12 | 0 | 0 | 1 | 0 | 1 | 0 | 1 | 1 | Dbl $\pi$ |
| 13 | 0 | 0 | 0 | 0 | 0 | 1 | 0 | 0 | T |
| 14 | 0 | 0 | 0 | 0 | 0 | 1 | 1 | 0 | Dbl $\pi$ |

As shown in FIG. 3 the attenuation steps are approximately 1 dB each and the attenuation varies from about $-2$ dB to about $-15.5$ dB over a frequency range of 1 to 11 GHz.

Figure 4:
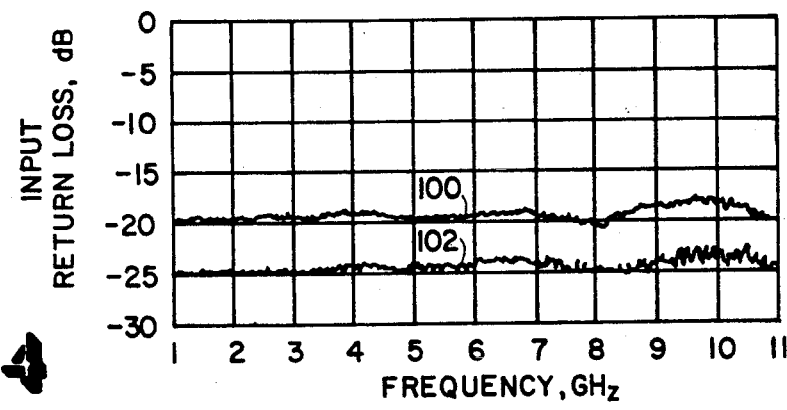
FIG. 4 is a diagram showing the input return loss of the circuit of FIG. 2.
Figure 5:
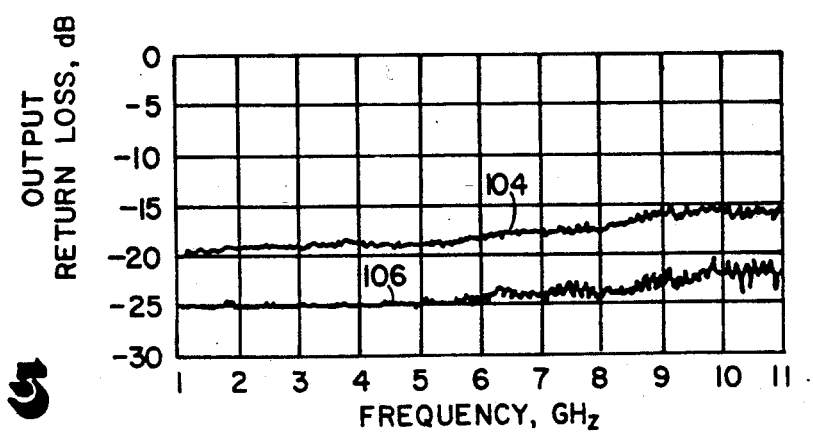
FIG. 5 is a diagram showing the output return loss of the circuit of FIG. 2.

An effective attenuator not only provides affective control of attenuation level, and at discrete steps in the case of a digital attenuator, but also provides close impedance matching at the input and output. FIGS. 4 and 5 show the input and output return loss for the circuit of FIG. 2. Specifically, in FIG. 4, the top curve 100 shows that the input return loss at the minimum attenuation level is over $-18$ dB over almost the entire frequency range, whereas at the maximum attenuation level, the input return loss represented by curve 102 is over −23 dB.

Similar results are shown for the output return loss. Upper curve 104, again representing the minimum attenuation condition, is less than −15 dB. As shown by curve 106, at the maximum attenuation level, attenuator 10 produces an output return loss of less than −21 dB over the frequency range shown.

Attenuator 10 thus provides attenuation steps corresponding to a four-bit digital attenuator while providing close impedance matching and the minimization of switches in the main signal path. A single composite structure defines all of the attenuation states, thereby reducing the cumulative insertion loss required in conventional cascaded design approaches. Clearly more or fewer legs of each of the first, second and third impedances, other values for gate widths and in-line resistors, other combinations of dual and single gate FETs, and other configurations can be used to accomplish the same or other attenuation levels.

It will thus be appreciated by those skilled in the art that the preferred embodiment is described for purposes of illustration, rather than limitation. Variations in form and detail may be made without varying from the spirit and scope of the invention as defined in the claims.

We claim:

1. A variable attenuator comprising:
   an input terminal for receiving an input signal to be attenuated;
   an output terminal for outputting the attenuated input signal;
   a pair of first resistance means extending in series between the input terminal and the output terminal, the two first resistance means joining at a junction;
   a second resistance means controllable for selectively coupling the junction between the pair of first resistance means to a reference voltage; and
   a pair of third resistance means controllable jointly for selectively coupling the input terminal and the output terminal to the reference voltage.

2. An attenuator according to claim 1 wherein the pair of third resistance means includes a plurality of pairs of first field-effect transistor means (FETs), the FETs in different pairs having gates with different widths, each pair of first FETs having gates with the same width and being separately controllable, and each FET of each pair coupling a respective one of the input terminal and output terminal to the reference voltage.

3. An attenuator according to claim 2 wherein the second resistance means includes a plurality of second FETs having gates with different widths, with each second FET being separately controllable for coupling the junction to the reference voltage.

4. An attenuator according to claim 3 wherein the pair of third resistance means includes a plurality of pairs of third FETs having gates of different widths, each pair of third FETs having gates of the same width and being separately controllable, and each first FET of each pair coupling a respective one of the input terminal and the output terminal to the junction.

5. An attenuator according to claim 4 wherein the pair of first resistance means further includes a pair of resistors, each resistor being connected in parallel with respective ones of the third FETs for coupling the respective one of the input terminal and the output terminal to the junction.

6. An attenuator according to claim 1 wherein the pair of first resistance means includes a pair of resistors, each resistor coupling a respective one of the input terminal and the output terminal to the junction.

7. An attenuator according to claim 6 wherein the pair of first resistance means further includes a plurality of pairs of field-effect transistor means (FETs) having gates of different widths, each pair of FETs having gates of the same width and being separately controllable, and each FET of each pair being connected in parallel with a respective one of the resistors for coupling the respective one of the input terminal and the output terminal to the junction.

8. A variable attenuator comprising:
   an input terminal for receiving an input signal to be attenuated;
   an output terminal for outputting the attenuated input signal;
   a first resistance means extending between the input terminal and the output terminal, and comprising a resistor in parallel with a first field-effect transistor means (FET) having a gate of a predetermined width, the first FET being controllable for selectively coupling the input terminal to the output terminal; and
   a second resistance means for coupling directly one of the input terminal and the output terminal to a reference voltage and includes a predetermined plurality of independently controllable, parallel second FETs having gates with different widths.

9. An attenuator according to claim 8 wherein the second resistance means couples the input terminal to the reference voltage, the attenuator further comprising a third resistance means including a plurality of parallel third FETs coupling the output terminal to the reference voltage, there being a third FET corresponding to each second FET with each third FET having a gate with a width corresponding to the width of the corresponding second FET; each third FET being controllable jointly with the corresponding one of the second FETs having the same gate width for selectively coupling the respective terminals to the reference voltage.

10. A digital attenuator comprising:
    an input terminal for receiving an input signal to be attenuated;
    an output terminal for outputting the attenuated input signal;
    a pair of resistors connected in series between the input terminal and the output terminal, the two resistors joining at a junction;
    a pair of first filed-effect transistor means (FETs) having gates with a first width and being jointly controllable, each of the first pair of first FETs being connected in parallel with a respective one of the resistors;
    a pair of second FETs having gates with a second width and being jointly controllable, each of the second pair of FETs being connected in parallel with a respective one of the resistors;
    third and fourth FETs having gates with different widths, connected in parallel and separately controllable for coupling selectively the junction to a reference voltage;
    a pair of fifth FETs having gates with the same width and being jointly controllable, each fifth FET coupling selectively a respective one of the input terminal and output terminal to the reference voltage; and a pair of sixth FETs also having gates with the same width and being jointly controllable, each sixth FET coupling selectively a respective one of the input terminal and output terminal to the reference voltage;

each pair of first, second, fifth and sixth FETs being controllable independently from each other pair of FETs and independently from the third and fourth FETs for varying the configuration and attenuation of the attenuator.

11. An attenuator according to claim 10 further comprising a third resistor in series with one of the FETs.

* * * * *